United States Patent
West et al.

(10) Patent No.: US 9,818,828 B2
(45) Date of Patent: Nov. 14, 2017

(54) TERMINATION TRENCH STRUCTURES FOR HIGH-VOLTAGE SPLIT-GATE MOS DEVICES

(71) Applicants: Polar Semiconductor, LLC, Bloomington, MN (US); SANKEN ELECTRIC CO., LTD., Saitama (JP)

(72) Inventors: Peter West, Minneapolis, MN (US); Steven Kosier, Lakeville, MN (US); Tatsuya Kamimura, St. Louis Park, MN (US); Don Rankila, Farmington, MN (US)

(73) Assignees: POLAR SEMICONDUCTOR, LLC, Bloomington, MN (US); SANKEN ELECTRIC CO., LTD., Saitama (JP)

( * ) Notice: Subject to any disclaimer, the term of this patent is extended or adjusted under 35 U.S.C. 154(b) by 0 days.

(21) Appl. No.: 15/065,303

(22) Filed: Mar. 9, 2016

(65) Prior Publication Data
US 2017/0263718 A1    Sep. 14, 2017

(51) Int. Cl.
*H01L 29/40* (2006.01)
*H01L 29/10* (2006.01)
(Continued)

(52) U.S. Cl.
CPC ...... *H01L 29/407* (2013.01); *H01L 21/02164* (2013.01); *H01L 21/30604* (2013.01);
(Continued)

(58) Field of Classification Search
CPC .............. H01L 29/407; H01L 21/02164; H01L 21/30604
See application file for complete search history.

(56) References Cited

U.S. PATENT DOCUMENTS 6,635,944 B2    10/2003  Stoisiek
6,806,533 B2    10/2004  Henninger et al.
(Continued)

OTHER PUBLICATIONS

Eun Sik Jung et al., "A Study of Field-Ring Design using a Variety of Analysis Method in Insulated Gate Bipolar Transistor (IGBT)", Electral Engineering Technology, vol. 9, No. 6, pp. 1995-2003, 2014.
(Continued)

*Primary Examiner* — Errol Fernandes
(74) *Attorney, Agent, or Firm* — Kinney & Lange, P.A.

(57) ABSTRACT

Apparatus and associated methods relate to an edge-termination structure surrounding a high-voltage MOSFET for reducing a peak lateral electric field. The edge-termination structure includes a sequence of annular trenches and semiconductor pillars circumscribing the high-voltage MOSFET. Each of the annular trenches is laterally separated from the other annular trenches by one of the semiconductor pillars. Each of the annular trenches has dielectric sidewalls and a dielectric bottom electrically isolating a conductive core within each of the annular trenches from a drain-biased region of the semiconductor pillar outside of and adjacent to the annular trench. The conductive core of the innermost trench is biased, while the conductive cores of one or more outer trenches are floating. In some embodiments, a surface of an inner semiconductor pillar is biased as well. The peak lateral electric field can advantageously be reduced by physical arrangement of trenches and electrical biasing sequence.

26 Claims, 6 Drawing Sheets

(51) Int. Cl.
   *H01L 29/08*   (2006.01)
   *H01L 29/06*   (2006.01)
   *H01L 29/78*   (2006.01)
   *H01L 21/306*  (2006.01)
   *H01L 21/02*   (2006.01)
   *H01L 21/3205* (2006.01)
   *H01L 29/66*   (2006.01)

(52) U.S. Cl.
   CPC .... *H01L 21/32055* (2013.01); *H01L 29/0692* (2013.01); *H01L 29/0865* (2013.01); *H01L 29/1095* (2013.01); *H01L 29/404* (2013.01); *H01L 29/66712* (2013.01); *H01L 29/7811* (2013.01)

(56) References Cited

U.S. PATENT DOCUMENTS

| | | | |
|---|---|---|---|
| 7,274,077 | B2 | 9/2007 | Henninger et al. |
| 7,372,103 | B2 | 5/2008 | Zundel et al. |
| 7,615,847 | B2 | 11/2009 | Zundel et al. |
| 7,880,226 | B2 | 2/2011 | Hiller et al. |
| 8,080,858 | B2 | 12/2011 | Hirler et al. |
| 8,264,033 | B2 | 9/2012 | Pfirsch et al. |
| 8,482,062 | B2 | 7/2013 | Pfirsch et al. |
| 8,786,045 | B2 | 7/2014 | Challa et al. |
| 8,853,029 | B2 | 10/2014 | Denison et al. |
| 8,963,212 | B2 | 2/2015 | Yedinak et al. |
| 2003/0047779 | A1* | 3/2003 | Peake .................. H01L 29/402 257/341 |
| 2013/0037906 | A1* | 2/2013 | Hirler .................. H01L 21/761 257/506 |
| 2015/0380542 | A1* | 12/2015 | Weyers ............... H01L 29/0634 257/329 |
| 2016/0141376 | A1* | 5/2016 | Rothmaler ........ H01L 29/42372 257/329 |

OTHER PUBLICATIONS

C Pace et al., "A model for avalanche breakdown calculation in low-voltage trench power MOSFET devices", Semiconductor Science and Technology 28, pp. 1-6, 2013.

Hemal Shah et al., "From Planar to Trench—Evaluation of Ruggedness across Various Generations of Power MOSFETs and Implication on In-circuit Performance", 2008.

* cited by examiner

TERMINATION TRENCH STRUCTURES FOR HIGH-VOLTAGE SPLIT-GATE MOS DEVICES

BACKGROUND

Power MOSFETs are a type of Metal Oxide Semiconductor Field Effect Transistor (MOSFET) that is designed to handle significant power levels. Some of these devices are designed to switch high currents and to have low on resistance. Some of these devices are designed to tolerate high voltages across the device's terminals. The voltage tolerance and current requirements have resulted in device configurations different from tradition MOSFET designs. One such device configuration involves trenches, which have been used to provide vertical channel conduction for such power MOSFETS. Orienting these MOSFETS vertically has improved the layout efficiency of such devices.

These high-voltage trench MOSFETS can have a backside or substrate terminal connection (e.g., drain connection). When providing electrical connection to the drain via the substrate, much of the semiconductor die will be biased in response to the voltage applied to the substrate. This bias voltage will be electrically communicated from the backside contact surface up throughout much of the die. The bias voltage will be electrically transmitted where the conductivity is high and where no semiconductor junctions are encountered. These high voltages should be controlled so that undesirable breakdowns do not occur.

SUMMARY

Apparatus and associated methods relate to an edge-termination structure surrounding a high-voltage MOSFET for reducing a peak lateral electric field. The edge-termination structure includes a sequence of annular trenches and semiconductor pillars circumscribing the high-voltage MOSFET. Each of the annular trenches is laterally separated from the other annular trenches by one of the semiconductor pillars. Each of the annular trenches has dielectric sidewalls and a dielectric bottom, the dielectric sidewalls and dielectric bottom electrically isolating a conductive core within each of the annular trenches from a drain-biased region of the semiconductor pillar outside of and adjacent to the annular trench.

The sequence of annular trenches and semiconductor pillars includes a first semiconductor pillar having a top surface contact providing electrical connection between a first conductor and the top surface of the first semiconductor pillar. The sequence includes a first annular trench adjacent to and circumscribing the first semiconductor pillar, the conductive core of the first annular trench electrically connected with the first conductor. The sequence includes a second semiconductor pillar adjacent to and circumscribing the first annular trench, the second semiconductor pillar having a top surface that is not electrically connected to the first conductor. The sequence includes a second annular trench adjacent to and circumscribing the second semiconductor pillar, the conductive core of the second annular trench electrically connected with the first conductor. The sequence also includes a third annular trench circumscribing the second annular trench, the conductive core of the third annular trench not electrically connected with the first conductor.

In an exemplary embodiment, the edge-termination structure includes a sequence of annular trenches circumscribing the high-voltage MOSFET. The sequence of annular trenches includes an innermost annular trench. The conductive core of the innermost annular trench is electrically coupled to a body of the high-voltage MOSFET. The sequence includes an intermediate annular trench. The conductive core of the intermediate annular trench has a top-surface field-plate extension and is electrically coupled to the body of the high-voltage MOSFET. The sequence also includes an outermost annular trench. The conductive core of the outermost annular trench has a top-surface field-plate extension and is electrically unconnected to each of a source, a drain, a gate, and the body of the high-voltage MOSFET.

An exemplary method of manufacturing an edge-termination structure surrounding a high-voltage MOSFET includes the step of etching a sequence of annular trenches circumscribing the high-voltage MOSFET, the sequence including an innermost, an intermediate and an outermost annular trench. The method includes the step of forming a dielectric layer on sidewalls and a bottom of each of the trenches. The method includes the step of depositing a conductive core into each of the trenches, the conductive core within each of the annular trenches electrically isolated from a drain-biased region of semiconductor outside of and adjacent to the annular trench. The method includes the step of electrically connecting the conductive cores of the innermost and intermediate trenches to a body of the high-voltage MOSFET. The method includes the step of isolating the conductive core of the outermost trench from a source, a gate, a drain, and the body of the high-voltage MOSFET. The method also includes the step of forming a top-surface field-plate extension of the core of each of the intermediate and outermost trenches, each of the top-surface field-plate extensions extended from a top of the conductive core and laterally over a top surface of the semiconductor exterior and adjacent to the trench.

DETAILED DESCRIPTION

An edge-termination structure can be used to reduce a peak lateral electric field directed to or from and edge of a semiconductor die from or to a high voltage device inscribed therein. The edge-termination structure may buffer high voltages that can be present at a top surface and edge perimeter of a die. Voltage-sensitive circuitry that resides within the edge perimeter can be protected by such high-voltage buffers. The edge-termination structure can include a series of annular trenches circumscribing the high-voltage device. Reducing the peak lateral electric field can be achieved by stepping down the voltage across each of the series of annular trenches, so that the voltage-sensitive circuitry is not exposed to voltages in excess of a rated or specified maximum amplitude.

Figure 1:
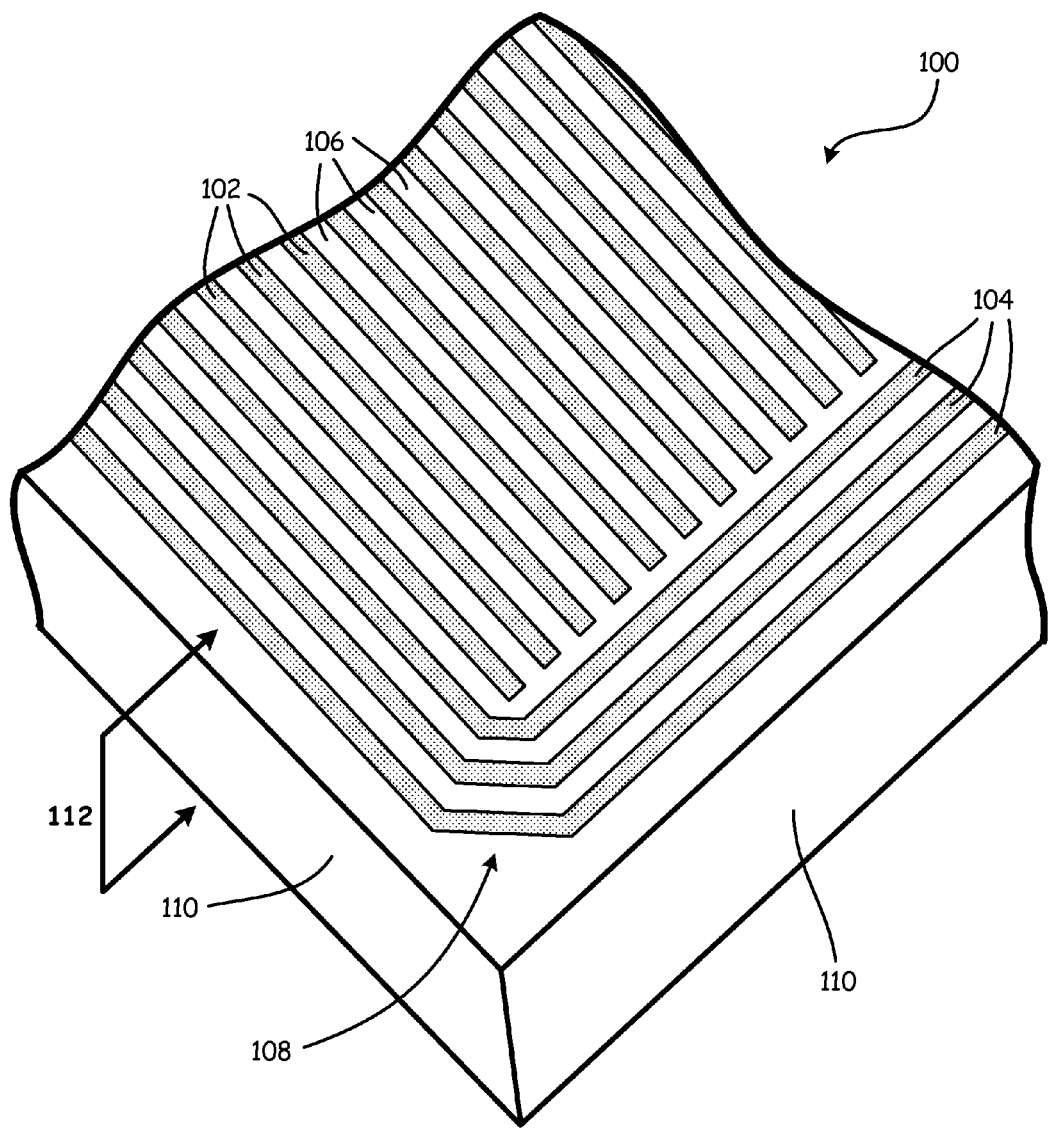
FIG. 1 is a perspective view of a trench-MOSFET die that has an edge-termination structure that circumscribes a trench-MOSFET.

FIG. 1 is a perspective view of a trench-MOSFET die that has an edge-termination structure that circumscribes a trench-MOSFET. In FIG. 1, semiconductor die 100 has a series of parallel MOSFET trenches 102 and a series of edge-termination trenches 104 circumscribing MOSFET trenches 102. MOSFET trenches 102 are arranged as a regular series of parallel lines. In other embodiments, MOSFET trenches 102 can be arranged differently. Between each pair of MOSFET trenches 102 is one of MOSFET pillars 106. MOSFET pillars 106 can have a source region, a body region and a drain region adjacent to each of sandwiching MOSFET trenches 102. Each of MOSFET trenches 102 can have dielectric sidewalls and a dielectric bottom isolating a field plate and one or more MOSFET gates within. Each of the MOSFET gates is juxtaposed adjacent to a MOSFET body, but electrically separated from the MOSFET body by a gate dielectric. Each MOSFET gate controls the conduction between the source and the drain in the adjacent MOSFET pillar 106.

The number of rows in the series of MOSFET trenches 102 determines the number of gate stripes in the MOSFET device. The length of each MOSFET trench 102 determines the gate width of the MOSFET device. Thus, if each of the MOSFET devices is electrically wired together in parallel fashion, the effective gate width would be the product of the actual row's gate width and the number of gates. Decreasing the pitch of the series of MOSFET trenches 102 permits the number of gates in the MOSFET device to be increased. But as the pitch decreases, one or more device parameters may be negatively affected. For example, as the pitch decreases, the on-resistance of each stripe can increase. Processing limitations can also present lower limits to the trench pitch. For example, photolithography can present a lower limit for reliable contacting of the MOSFET' s source and body regions.

Edge-termination trenches 104 are similarly arranged as a series of parallel trenches. In the embodiment shown, edge-termination trenches are bent at corners 108 of semiconductor die 100. The purpose of edge-termination trenches 104 is to reduce a peak in the lateral electric field from edges 110 of semiconductor die 100 to MOSFET trenches 102. The drain of the MOSFET device can be contacted via a backside of semiconductor die 100. The entire substrate is then biased by such a backside contact.

If a MOSFET device is designed to tolerate high voltages at the drain contact, such high voltages would be present throughout the substrate region of the die between opposite edges 110 of semiconductor die 100. A source, body, and gate of such a MOSFET device, however, can have a maximum voltage limit that is much lower than the voltage bias of the drain. Thus, if the high-voltage region is too close to one of the low-voltage regions, deleterious effects can result.

Increasing a separation distance between the high-voltage regions and the low-voltage regions results in lowering the electric fields. Edge-termination trenches 104 provide such a lateral separation distance between a high-voltage edge 110 of semiconductor die 100 and MOSFET trenches 102 that termination trenches 104 circumscribe.

Design and control of both semiconductor pillars and annular trenches can be used to achieve a target value of a peak lateral electric field. Semiconductor pillar design parameters can include pillar width, pillar dopant concentrations, and pillar biasing. Annular-trench design parameters can include trench width, dielectric geometry, conductive core geometry, and conductive core biasing. Additional design parameters can include top field plate geometry and biasing. Each of these design parameters can vary between inside annular trenches or semiconductor pillars and outside annular trenches or semiconductor pillars. As will be described below, careful choice of such design parameters can advantageously reduce a peak lateral electric field around a periphery of a voltage-sensitive device.

Figure 2A:
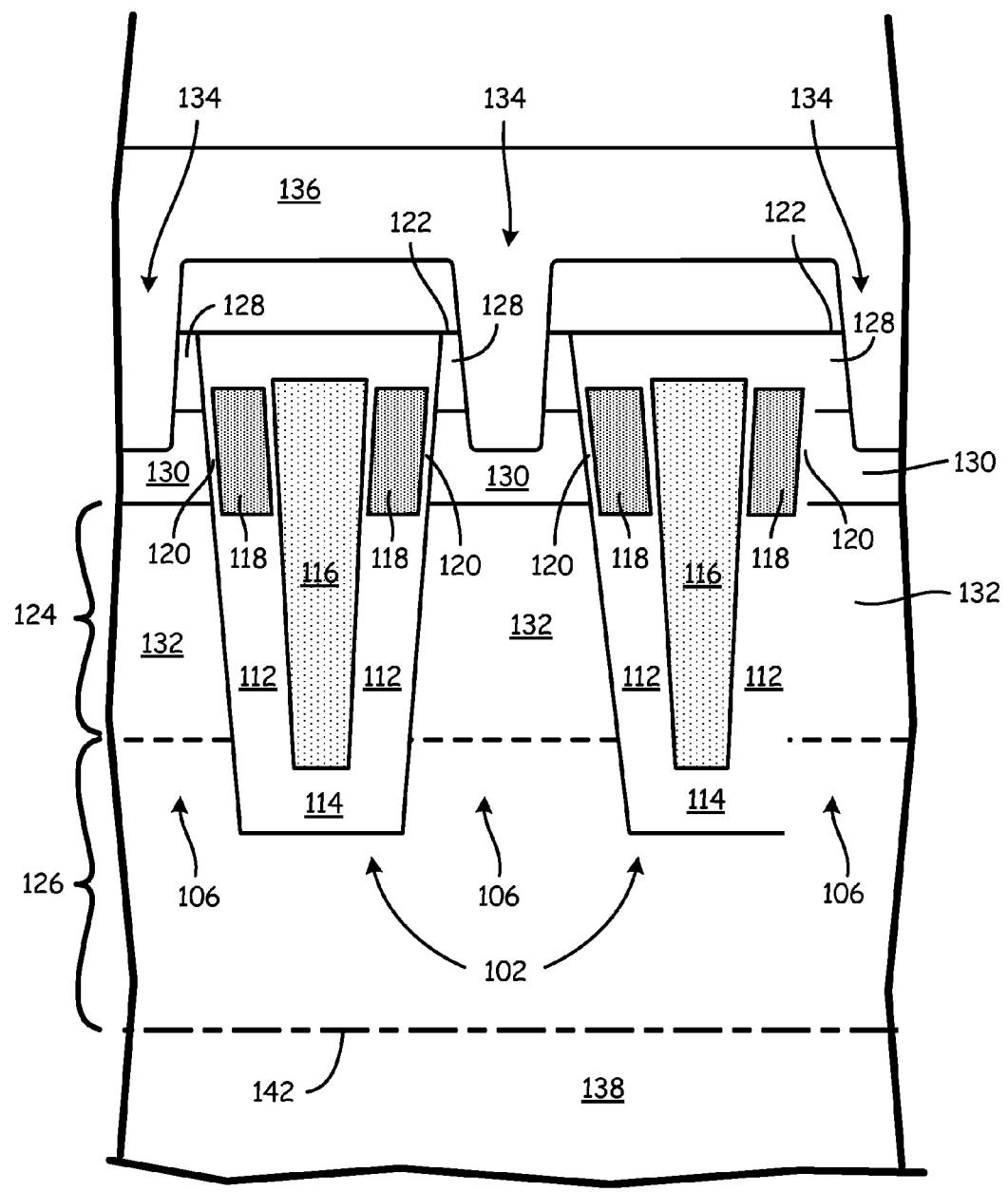
FIGS. 2A-2B are cross-sectional views of an exemplary split-gate trench and an exemplary field-plate trench.
Figure 2B:
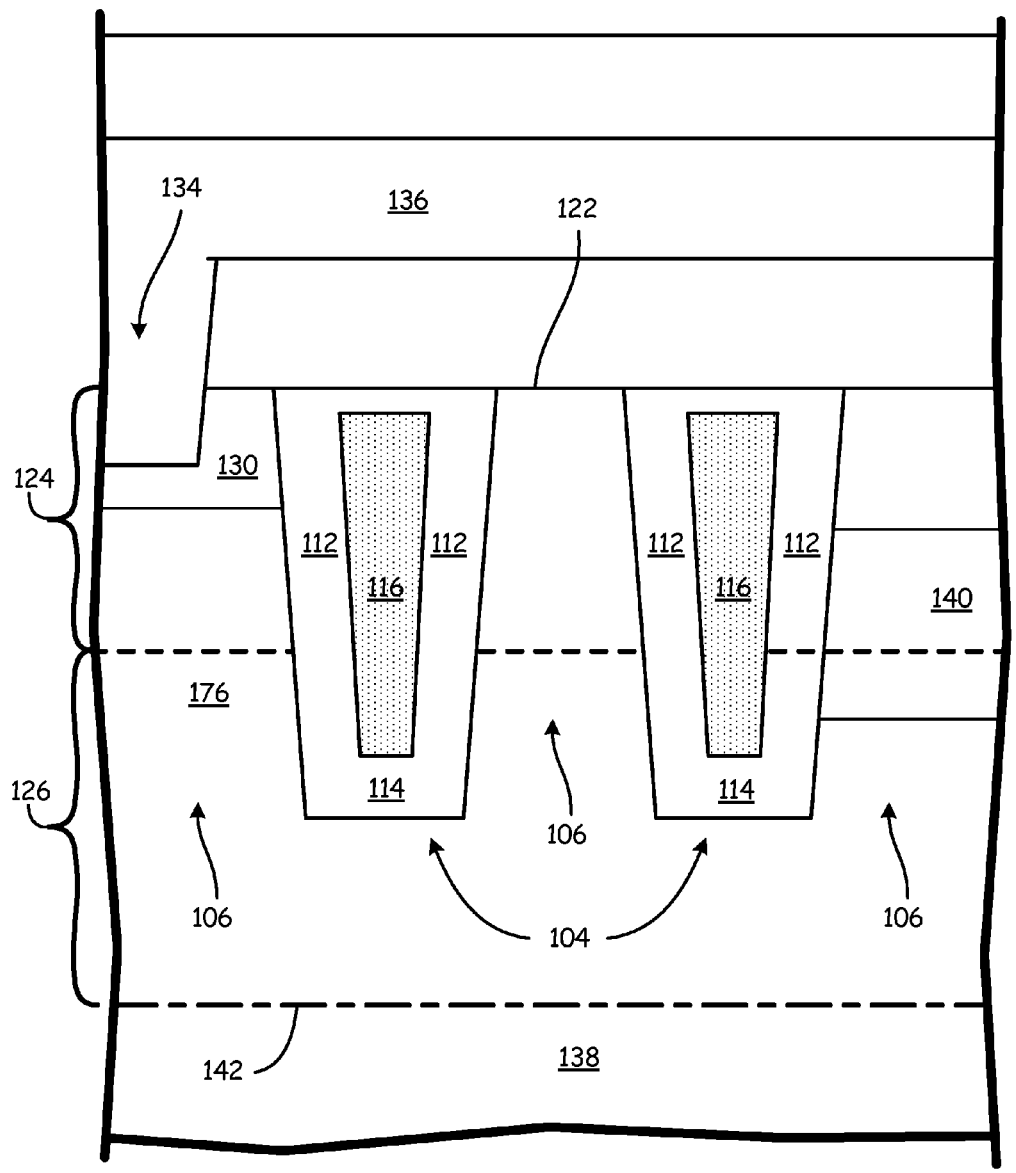

FIGS. 2A-2B are cross-sectional views of exemplary MOSFET trenches and exemplary edge-termination trenches, respectively. In FIG. 2A, MOSFET trenches 102 are cross-sectional views of those MOSFET trenches 102 depicted in the perspective view shown in FIG. 1. MOSFET trenches 102 include dielectric sidewalls 112, dielectric bottom 114, field plate 116, gates 118 and gate dielectric 120. Dielectric sidewalls 112 and dielectric bottom 114 isolate field plate 116 from surrounding semiconductor material. Gate dielectric 120 may be relatively thin so as to facilitate a field effect of gates 118 upon semiconductor material adjacent to MOSFET trench 102. Gate 118 can be polysilicon, and dielectrics 112, 114, 120 can be silicon-dioxide, for example. MOSFET trench 102 extends from top semiconductor surface 122 through second epitaxial layer 124 and into first epitaxial layer 126.

Between adjacent MOSFET trenches 102 are MOSFET pillars 106. Each MOSFET pillar 106 has source 128, body 130, and drain 132 regions. Gate 118 is separated from source 128, body 130, and drain 132 by gate dielectric 120. Source 128 and drain 132 can both be doped with n-type dopants (e.g. phosphorus, arsenic, antimony, etc.) to create an n-type MOSFET. Conversely, source 128 and drain 132 can both be doped with p-type dopants (e.g. boron, etc.) to create a p-type MOSFET. Body 130 will then be doped the type opposite that of source 128 and drain 132 for enhancement mode devices. Contact 134 provides electrical connection between both source 128 and body 132 and source metalization feature 136. In the depicted embodiment, both source 128 and body 130 are connected with source metallization feature 136 via contact 134. Thus, body 130 will be biased the same as source 128 in this embodiment.

MOSFET trench 102 includes gates 118 on either lateral side of field plate 116. Field plate 116 may be biased such that field plates 116 in adjacent trenches 102 effectively shield intervening MOSFET pillars 106 from excessive voltage. Drain 132 may be biased with a high voltage, for example, via a backside die connection. Field plates 116 on either side of each semiconductor pillar 106 can effectively shield the semiconductor pillar 106 therebetween from voltages that might cause breakdown of a MOSFET created therein. A MOSFET device is created by such juxtaposition of variously doped regions 128, 130, 132 in MOSFET pillar 106 and gates 118 embedded in MOSFET trenches 102.

Junctionless electrical continuity of drain 132 is maintained from the metallurgical junction formed between body 130 and drain 132 through substrate 138 to the backside of the semiconductor die 100. Such junctionless continuity can be achieved if first epitaxial layer 126, second epitaxial layer 124 and substrate 138 are all doped with the same type of dopant (e.g., all p-type or all n-type). Body 130 is formed within second epitaxial layer 124. Second epitaxial layer 124 can be doped more heavily than first epitaxial layer 126, providing a low on resistance to the MOSFET. Thus, drain 132 has a junctionless electrical conductivity path from second epitaxial layer 124, through first epitaxial layer 126 to substrate 138.

In FIG. 2B, exemplary edge-termination trenches 104 are shown in cross-sectional detail. Edge-termination trench 104 has field plate 116 isolated from surrounding semiconductor pillars 106 by dielectric sidewalls 112. Field plate 116 is isolated from underlying first epitaxial layer 124 by dielectric bottom 114. Edge-termination trench 104 extends from top semiconductor surface 122 through second epitaxial layer 124 and into first epitaxial layer 126. Three types of semiconductor pillars 106 are shown in FIG. 2B. Leftmost semiconductor pillar 106 includes body region 130 which is contacted by contact 134. Center semiconductor pillar 106 has no body region 130 and is uncontacted. Rightmost semiconductor pillar 106 includes buried layer 140.

Buried layer 140 might be formed by implanting a dopant species into first epitaxial layer 126 before second epitaxial layer 124 was grown, for example. The implanted dopant species of buried layer 140 can be of an opposite type to that of both first epitaxial layer 126 and second epitaxial layer 124. Such semiconductor pillars 106 as the one depicted with buried layer 140 have two metallurgical junctions. Each of the two metallurgical junctions will have depletion regions in which the majority carriers can be significantly depleted. A peak dopant concentration of buried layer 140 can have a depth location above a depth location of dielectric bottom 114 of edge-termination trenches 104.

Each of the three types of pillars can perform a function specific to that type of pillar. The sequence of such pillars can be selected to minimize a peak lateral electric field about a periphery of semiconductor die 100. Various arrangements of the edge-termination semiconductor pillars 106 and the various edge-termination trenches 104 will be shown below.

When substrate 138 is biased to a high positive voltage and metallization features 136 and field plates 116 are biased to relatively low voltages with respect to the voltage biasing substrate 138, an electrical field will be established in pillars 106. The established electric field can have a general vertical direction, from substrate 138 to semiconductor top surface 122. Wherever such a field exists, free charge carriers will respond accordingly.

One idea behind the use of trenches 102, 104 is to establish a vertical voltage gradient between first epitaxial layer/substrate interface 142 and dielectric bottom 114. The vertical voltage gradient is set up much like a MOSFET gate capacitor sets up a voltage gradient in the channel region of the device. A large difference in voltage between the substrate 138 and the field plates 116 will result in a large depletion region extending between dielectric bottoms 114 toward substrate 138. Some of the voltage difference will appear across dielectric bottom 114 and the rest of it will appear across the depletion region. The voltage gradient across the depletion region will establish an electric field across the depletion region. Any free carriers within the depletion region will flow in response to the electric field therein. Simultaneously to such drift current, diffusion current within the depletion region will flow in a direction opposite to such drift current. Under zero net-current conditions, the drift current will be equal and opposite to the diffusion current in the depletion region.

If adjacent trenches 102, 104 are closely spaced to one another, the voltage of the adjacent semiconductor pillar 106 will be approximately equal to the voltage of the dielectric-bottom/depletion-region-interface at equal depth locations. The term 'entrance to a pillar' can be used for the region of a semiconductor pillar 106 at a depth location equal to the dielectric bottom 114 of an adjacent trench 102, 104. Factors that can determine the voltage at the bottom-dielectric/depletion-region-interface include the net dopant concentration in second epitaxial layer 124 and a thickness of dielectric bottom 114, as well as voltages at substrate 138 and field plate 116. Such parameters are carefully considered so as to meet target specifications for the semiconductor die 100.

Field plates 116 in adjacent and closely spaced trenches 102, 104 can be biased so as to cause significant depletion of charge carriers within drain regions 132 of intervening semiconductor pillars 106. Creating metallurgical junctions in semiconductor pillars 106 can result in a reduction of charge carriers in the depletion regions associated with such junctions. Biasing conditions of field plates 116 and substrates 138 can make the depletion of charge carriers in semiconductor pillars 106 more favorable for one type of dopant species over the other, for example.

Because charge carriers are responsive to electric fields, free charge carriers within semiconductor pillars 106 can respond to such fields and move along field lines. The field lines, being substantially vertically oriented in semiconductor pillars 106 may result in a buildup of such free charge carriers at semiconductor/dielectric interface 122. In some embodiments, such charge carriers may be removed by providing a conduction path for them. For example, source metallization feature 136 might be connected to semiconductor top surface 122 via contact 134. In other embodiments, no such contacts might be provided, as such charge buildup may not be deemed deleterious, and in some circumstances may be considered advantageous.

Figure 3:
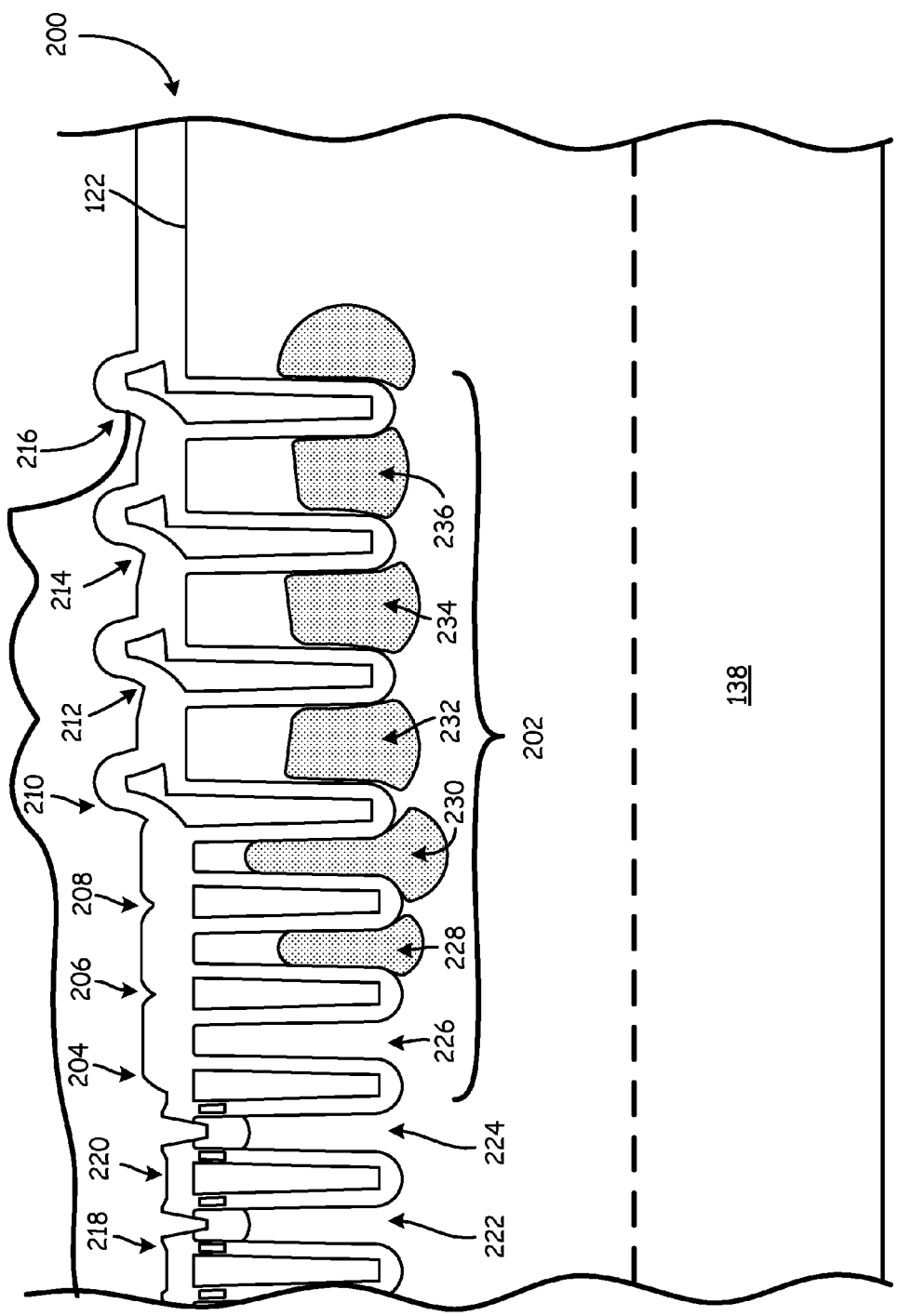
FIG. 3 is a cross-sectional view of a trench-MOSFET die depicting an exemplary edge-termination structure.

FIG. 3 is a cross-sectional view of a trench-MOSFET die depicting an exemplary edge-termination structure. In FIG. 3, cross section 200 shows exemplary edge-termination structure 202 that includes seven edge-termination trenches 204, 206, 208, 210, 212, 214, 216. Cross section 200 also shows two MOSFET trenches 218, 220. MOSFET trenches 218, 220 can be similar or identical to trenches 102 of FIG. 2A.

Between each pair of adjacent trenches 204, 206, 208, 210, 212, 214, 216, 218, 220 is a semiconductor pillar 222, 224, 226, 228, 230, 232, 234, 236. Between the adjacent MOSFET trenches, 218, 220 is a MOSFET pillar 222. MOSFET pillar 222 can be similar or identical to pillar 106 of FIG. 2A. First edge-termination trench 204 can have a gate polysilicon structure on a left side of edge-termination trench 204 in some embodiments. Such a trench might be termed a transition trench. If first edge-termination trench 204 includes a biased gate polysilicon structure, then semiconductor pillar 224 might also be similar or identical to pillar 106 of FIG. 2A. Such trench/pillar combinations can be operative as a MOSFET device. In some embodiments, first edge-termination trench 204 might not have a gate polysilicon structure on the left side of edge-termination trench 204. Then, semiconductor pillar 224 might operate as a MOSFET only on a left side of semiconductor pillar 224. Such a pillar might be termed a transition pillar.

One purpose of using an edge-termination structure is to reduce a peak field intensity of a lateral electric field around a periphery of a high-voltage MOSFET device. The peak field intensity of a lateral electric field can be reduced by distributing the field over a large radial distance (e.g., directed toward an edge of a die). Such a radial distribution is accomplished by arranging and biasing alternating pillars and trenches in a fashion that results in such a lateral distribution. In the depicted embodiment, the leftmost three trenches of the edge-termination structure 202 are biased field-plate edge-termination trenches 204, 206, 208. Then follows a single biased laterally-extended field-plate trench 210. Edge-termination structure 202 is finished on the right end of FIG. 3 with three electrically isolated or floating laterally-extended field-plate trenches 212, 214, 216.

Semiconductor pillars 226, 228, 230, 232, 234, 236, together with edge-termination trenches 204, 206, 208, 210, 212, 214, 216 make up edge-termination structure 202. The leftmost semiconductor pillar 226 of edge-termination structure 202 is an epitaxy pillar. Epitaxy pillar 226 presents a junctionless path from top surface 122 to substrate 138. Epitaxy pillar 226 is uncontacted at top surface 122, and therefore has no topside supplied bias condition. Continuing to the right, the next two pillars 228, 230 are narrow buried layer pillars. Each of these pillars 228, 230 are narrow, which, in this example, indicates that they have the same lateral dimension as the MOSFET pillar 222. The rightmost three pillars 232, 234, 236 are wide buried layer pillars. Wide buried layer pillars 232, 234, 236 have a lateral dimension that is greater than the lateral dimension of MOSFET pillar 222. Buried layer pillars 228, 230, 232, 234, 236 each have buried layer 238. Each of buried layers 238 have a net dopant concentration of opposite type that of a net dopant concentration of both the substrate 138 and a pillar region between top surface 122 and buried layer 238.

Figure 4:
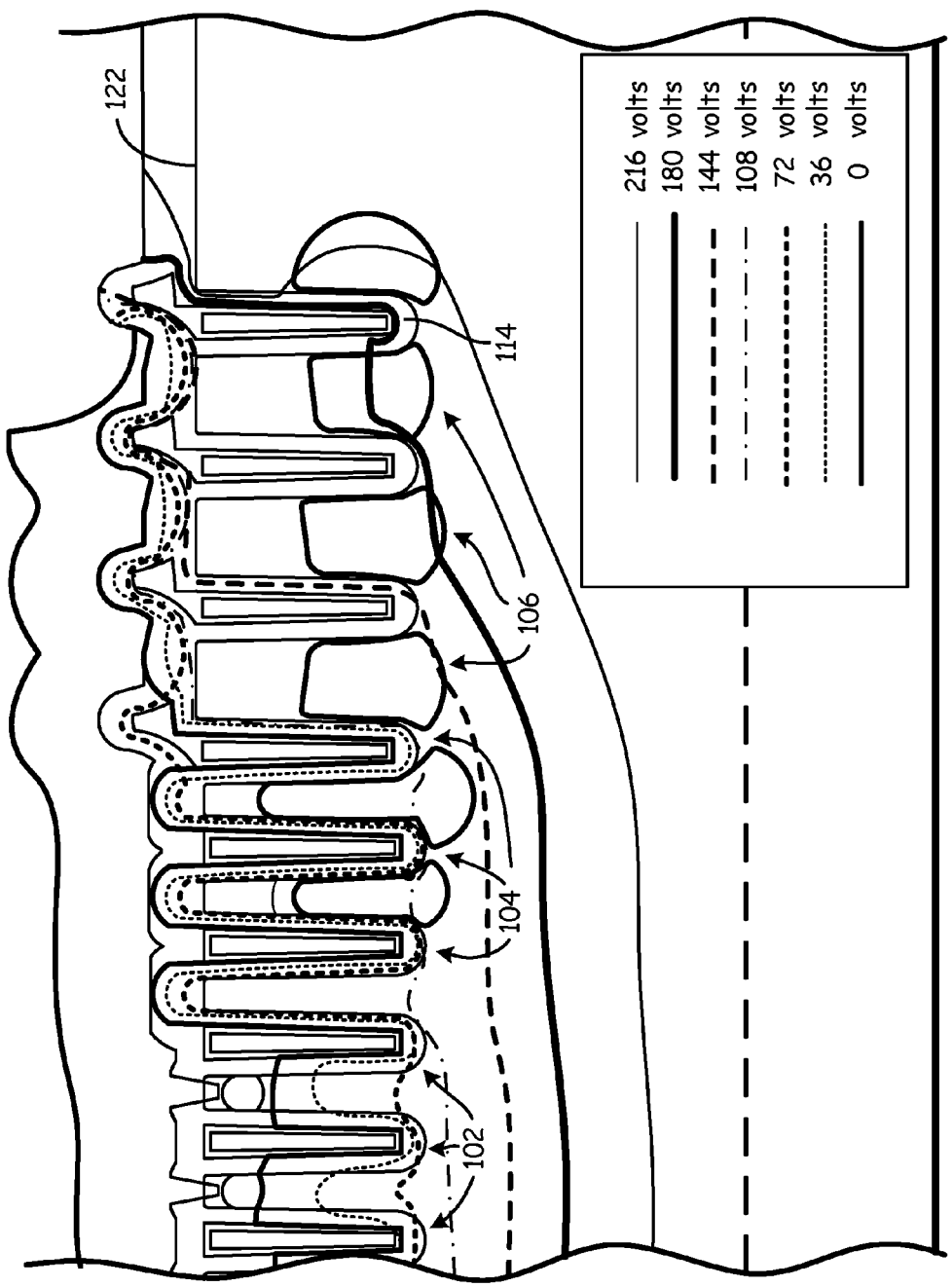
FIG. 4 is a cross-sectional view of a trench-MOSFET die showing an exemplary electrostatic field map.

FIG. 4 is a cross-sectional view of a trench-MOSFET die showing an exemplary electrostatic field map. The same cross section 200 depicted in FIG. 3 is shown in FIG. 4, but in FIG. 4 cross section 200 is annotated to show equipotential lines when semiconductor die 100 is biased. Equipotential lines help to visualize an electric field established when semiconductor die 100 is biased. The drain of trench-MOSFET die 100 has been biased to 216 volts, via a backside substrate contact. Where the equipotential lines are close to one another, the electric field is high, and where the equipotential lines are far apart from one another, the electric field is low.

Equipotential lines are annotated as 0, 36, 72, 108, 144, 180 and 216 Volts. Note that the voltage within semiconductor pillars 106 is relatively low for the leftmost semiconductor pillars 106 which are MOSFET pillars. Each of these leftmost semiconductor pillars 106 have a vertical voltage gradient from 0 volts at top surface 122 to about 100 volts at a depth location approximately equal to a depth location of dielectric bottom 114 of adjacent trenches 102, 104. Going to the right, the next four semiconductor pillars 106 are biased to about 100 volts. Each of these four semiconductor pillars 106 has approximately no vertical voltage gradient therein. Continuing to the right, the last two semiconductor pillars 106 are biased to voltages of around 180 volts. If one evaluates the voltage at top surface 122 of semiconductor pillars 106 going from left to right, one encounter voltages of about 0, 0, 100, 100, 100, 100, 170, and 190, before top surface 122 achieves its maximum voltage of 216 volts outside of the rightmost trench.

The lateral voltage gradient of top surface 122 of the semiconductor pillars experiences three significant changes in voltage. First, between the last top surface 122 biased MOSFET pillar 106 and the first unbiased epitaxy pillar 106, the voltage transitions from about zero volts to about 100 volts. Then, on either side of the last biased field plate trench 104, the voltage transitions from about 100 volts to about 170 volts. Finally, after the rightmost edge-termination trench 104, the voltage transitions from about 190 volts to the full drain bias of 216 volts. Thus, the electric field is laterally distributed by first going from a top surface 122 biased pillar 106 to an unbiased pillar 106 with an intervening biased field-plate trench 104. Then the electric field is further laterally distributed by going from a biased field plate trench 104 to unbiased field-plate trenches 104. Finally, the lateral field distribution finishes with the last trench 104.

Figure 5:
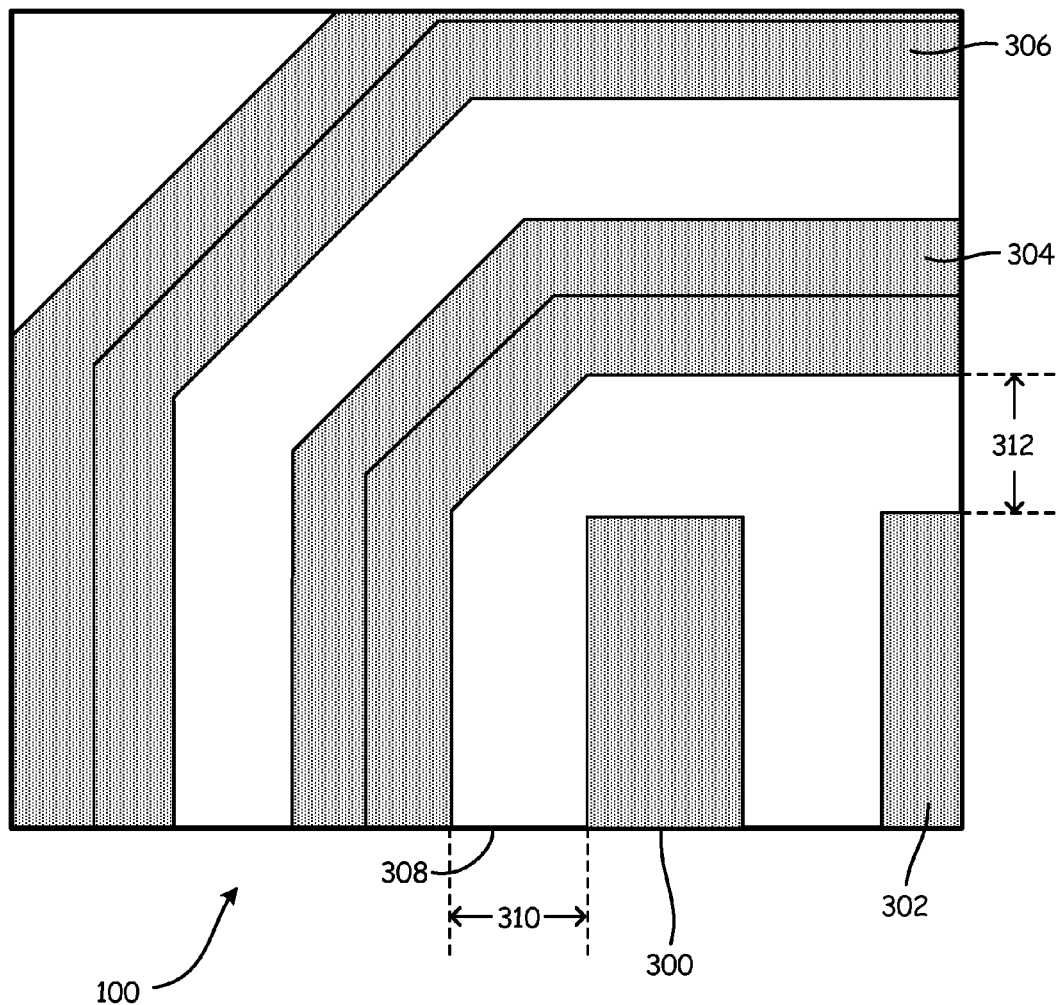
FIG. 5 is a plan view of an exemplary edge-termination structure in relation to a periphery of a trench MOSFET.

FIG. 5 is a plan view of an exemplary edge-termination structure in relation to a periphery of a trench MOSFET. In FIG. 5, semiconductor die 100 includes MOSFET trenches 300, 302 and edge-termination trenches 304, 306. MOSFET trenches 300, 302 are shown at a corner region of the semiconductor die 100. MOSFET trench 300 is a last trench in an array of MOSFET trenches. Each of MOSFET trenches 300, 302 are depicted at a lateral end of otherwise long trenches. Edge-termination trench 304 is an innermost trench in a series of edge-termination trenches. Between innermost edge-termination trench 304 and last MOSFET trench 300 is semiconductor pillar 308 having lateral dimension 310 of predetermined width. In the depicted embodiment, separation distance 312 between the lateral end of each of MOSFET trenches 300, 302 and innermost edge-termination trench 304 is substantially equal to the lateral dimension 310 of semiconductor pillar 308 between innermost edge-termination trench 304 and last MOSFET trench 300. Edge-termination trenches 304, 306 have chamfered corners 314, 316 at approximately 45 degrees. Such chamfered corners 314, 316 can advantageously reduce an electric field in chamfered corners 314, 316 compared with 90 degree trench corners. In some embodiments, edge-termination trenches 314, 316 circumscribe a high-voltage MOSFET, the circumscribing edge-termination trenches having a convex shape with exterior angles of all vertices less than 60 degrees In some embodiments, much of the semiconductor device will be drain biased. Drain biased, in this context, means that such drain-biased regions are in electrical communication with the drain in such a way that the voltage in the drain-biased regions varies in response to variations in the drain voltage. No reverse biased p-n junctions separate such drain-biased regions from the drain terminal.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An edge-termination structure surrounding a high-voltage MOSFET for reducing a peak lateral electric field, the edge-termination structure comprising:

a sequence of alternating annular trenches and semiconductor pillars circumscribing the high-voltage MOSFET, wherein each of the annular trenches has dielectric sidewalls and a dielectric bottom, the dielectric sidewalls and dielectric bottom electrically isolating a conductive core within each of the annular trenches from a drain-biased region outside of and adjacent to the annular trench, wherein the sequence of annular trenches and semiconductor pillars comprises:

a first semiconductor pillar having a top surface contact providing electrical connection between a first conductor and the top surface of the first semiconductor pillar;

a first annular trench adjacent to and circumscribing the first semiconductor pillar, the conductive core of the first annular trench electrically connected with the first conductor;

a second semiconductor pillar adjacent to and circumscribing the first annular trench, the second semiconductor pillar having a top surface that is not electrically connected to the first conductor;

a second annular trench adjacent to and circumscribing the second semiconductor pillar, the conductive core of the second annular trench electrically connected with the first conductor; and a third annular trench circumscribing the second annular trench, the conductive core of the third annular trench not electrically connected with the first conductor.

2. The edge-termination structure of claim 1, wherein the first conductor is electrically connected to a body of the high-voltage MOSFET.

3. The edge-termination structure of claim 1, wherein the first conductor is electrically connected to a source of the high-voltage MOSFET.

4. The edge-termination structure of claim 1, further comprising:

a metal layer overlaying the first annular trench and the second semiconductor pillar.

5. The edge-termination structure of claim 4, wherein the metal layer is electrically connected to the first conductor.

6. The edge-termination structure of claim 1, wherein each of the annular trenches of the sequence of annular trenches circumscribes the high-voltage MOSFET in a convex shape having exterior angles of all vertices less than 60 degrees.

7. The edge-termination structure of claim 1, wherein at least one of the conductive cores has a field-plate extension that laterally extends from the conductive core of the annular trench to above an adjacent semiconductor pillar in a direction toward an edge of a die on which the high-voltage MOSFET is formed.

8. The edge-termination structure of claim 1, wherein the dielectric sidewalls and dielectric bottom comprise silicon dioxide.

9. The edge-termination structure of claim 1, wherein the conductive core comprises polysilicon.

10. The edge-termination structure of claim 1, wherein one of the semiconductor pillars separating adjacent annular trenches includes a buried layer inverting a polarity of the one of the semiconductor pillars from an overlying uninverted region and an underlying uninverted region, wherein a peak net dopant concentration of the buried layer is at a depth location that is above a depth location of the dielectric bottom of the adjacent annular trenches.

11. An edge-termination structure surrounding a high-voltage MOSFET for reducing a peak lateral electric field, the edge-termination structure comprising:

a sequence of annular trenches circumscribing the high-voltage MOSFET, each of the annular trenches laterally separated from the other annular trenches by a semiconductor pillar, wherein each of the annular trenches has dielectric sidewalls and a dielectric bottom, the dielectric sidewalls and dielectric bottom electrically isolating a conductive core within each of the annular trenches from a drain-biased region of the semiconductor pillar outside of and adjacent to the annular trench, wherein the sequence of annular trenches and semiconductor pillars comprises:

an innermost annular trench, wherein the conductive core of the innermost annular trench is electrically coupled to a body of the high-voltage MOSFET;

an intermediate annular trench, wherein the conductive core of the intermediate annular trench has a top-surface field-plate extension and is electrically coupled to the body of the high-voltage MOSFET; and an outermost annular trench, wherein the conductive core of the outermost annular trench has a top-surface field-plate extension and is electrically unconnected to each of a source, a drain, a gate, and the body of the high-voltage MOSFET.

12. The edge-termination structure of claim 11, further comprising:

a metal layer overlaying the innermost annular trench and the intermediate annular trench with top-surface plate extension.

13. The edge-termination structure of claim 12, wherein the metal layer is electrically connected to the body of the high-voltage MOSFET.

14. The edge-termination structure of claim 11, wherein each of the annular trenches of the sequence of annular trenches circumscribes the high-voltage MOSFET in a convex shape having exterior angles of all vertices less than 60 degrees.

15. The edge-termination structure of claim 11, wherein the top-surface field-plate extension laterally extends from the conductive core of the annular trench to above an adjacent semiconductor pillar in a direction toward an edge of a die on which the high-voltage MOSFET is formed.

16. The edge-termination structure of claim 11, wherein the dielectric sidewalls and dielectric bottom comprise silicon dioxide.

17. The edge-termination structure of claim 11, wherein the conductive core comprises polysilicon.

18. The edge-termination structure of claim 11, wherein one of the semiconductor pillars separating adjacent annular trenches includes a buried layer inverting a polarity of the one of the semiconductor pillars from an overlying uninverted region and an underlying uninverted region, wherein a peak net dopant concentration of the buried layer is at a depth location that is above a depth location of the dielectric bottom of the adjacent annular trenches.

19. A method of manufacturing an edge-termination structure surrounding a high-voltage MOSFET, the method comprising:

etching a sequence of annular trenches circumscribing the high-voltage MOSFET, the sequence comprising an innermost, an intermediate and an outermost annular trench;

forming a dielectric layer on sidewalls and a bottom of each of the trenches;

depositing a conductive core into each of the trenches, the conductive core within each of the annular trenches electrically isolated from a drain-biased region of semiconductor outside of and adjacent to the annular trench;

electrically connecting the conductive cores of the innermost and intermediate trenches to a body of the high-voltage MOSFET;

isolating the conductive core of the outermost trench from a source, a gate, a drain, and the body of the high-voltage MOSFET; and forming a top-surface field-plate extension of the core of each of the intermediate and outermost trenches, each of the top-surface field-plate extensions extended from a top of the conductive core and laterally over a top surface of the semiconductor exterior and adjacent to the trench.

20. The method of claim 19, further comprising:
overlaying the innermost and intermediate trenches with a metal layer.

21. The method of claim 20, wherein the metal layer is electrically connected to the body of the high-voltage MOSFET.

22. The method of claim 19, wherein each of the sequence of annular trenches circumscribes the high-voltage MOSFET in a convex shape having exterior angles of all vertices less than 60 degrees.

23. The method of claim 19, wherein the top-surface field-plate extension laterally extends from the conductive core of the annular trench to above an adjacent semiconductor pillar.

24. The method of claim 19, wherein the dielectric sidewalls and dielectric bottom comprise silicon dioxide.

25. The method of claim 19, wherein the conductive core comprises polysilicon.

26. The method of claim 19, wherein the semiconductor between two of the annular trenches includes a buried layer inverting the polarity of the semiconductor from an overlying uninverted region and an underlying uninverted region, wherein a peak net dopant concentration of the buried layer is at a depth location that is above a depth location of the dielectric bottom of the adjacent trenches.

* * * * *